US011674859B2

(12) United States Patent
Joet et al.

(10) Patent No.: US 11,674,859 B2
(45) Date of Patent: Jun. 13, 2023

(54) MECHANICAL LINK FOR MEMS AND NEMS MECHANICAL STRUCTURE, AND MEMS AND NEMS STRUCTURE COMPRISING SUCH A MECHANICAL LINK

(71) Applicant: COMMISSARIAT A L'ENERGIE ATOMIQUE ET AUX ENERGIES ALTERNATIVES, Paris (FR)

(72) Inventors: Loïc Joet, Grenoble (FR); Patrice Rey, Grenoble (FR); Thierry Verdot, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 464 days.

(21) Appl. No.: 16/927,919

(22) Filed: Jul. 13, 2020

(65) Prior Publication Data

US 2021/0018378 A1 Jan. 21, 2021

(30) Foreign Application Priority Data

Jul. 18, 2019 (FR) ........................................ 1908130

(51) Int. Cl.
*G01L 1/14* (2006.01)
*G01L 1/16* (2006.01)
(Continued)

(52) U.S. Cl.
CPC ................. *G01L 1/142* (2013.01); *G01L 1/16* (2013.01); *G01L 1/18* (2013.01); *G01P 1/00* (2013.01);
(Continued)

(58) Field of Classification Search
CPC ......... B81B 3/0072; G01L 1/142; G01L 1/16; G01L 1/18; G01P 1/00; G01P 15/0922; G01P 15/097; G01P 15/123; G01P 15/125
See application file for complete search history.

(56) References Cited

U.S. PATENT DOCUMENTS 9,157,821 B2 * 10/2015 Robert .................... G01L 9/001
10,968,096 B2 * 4/2021 Joet ........................ B81B 3/0072
(Continued)

FOREIGN PATENT DOCUMENTS

FR 2 941 533 A1 7/2010
FR 2 951 826 A1 4/2011
(Continued)

*Primary Examiner* — Octavia Davis Hollington
(74) *Attorney, Agent, or Firm* — BakerHostetler

(57) ABSTRACT

A mechanical link for microelectromechanical and/or nanoelectromechanical structure, includes a mobile component, a fixed component extending on a plane, and apparatus for detecting displacement of the mobile component relative to the fixed component. The mechanical link includes: a first link to the fixed component and mobile component, allowing rotation of the mobile component relative to the fixed component about an axis of rotation; a second link connecting the mobile component to the detection apparatus at a distance and perpendicular to the axis of rotation; a third link to the fixed component and detection apparatus, guiding the detection apparatus in a direction of translation in the plane; wherein the combination of the second link and third link can transform rotational movement of the mobile component into translational movement of the detection apparatus in the direction of translation. The detection apparatus includes a piezoresistive/piezoelectric strain gauge, resonance beam, capacitance, or combination thereof.

21 Claims, 13 Drawing Sheets

(51) Int. Cl.
*G01L 1/18* (2006.01)
*G01P 1/00* (2006.01)
*G01P 15/09* (2006.01)
*G01P 15/097* (2006.01)
*G01P 15/12* (2006.01)
*G01P 15/125* (2006.01)

(52) U.S. Cl.
CPC ........ *G01P 15/097* (2013.01); *G01P 15/0922* (2013.01); *G01P 15/123* (2013.01); *G01P 15/125* (2013.01)

(56) References Cited

U.S. PATENT DOCUMENTS

| | | | |
|---|---|---|---|
| 11,085,945 B2* | 8/2021 | Joet | G01P 15/123 |
| 11,337,016 B2* | 5/2022 | Joet | H04R 17/02 |
| 11,384,789 B2* | 7/2022 | Rey | F16C 11/12 |
| 2012/0210792 A1* | 8/2012 | Robert | G01P 15/123 |
| | | | 216/13 |
| 2019/0177153 A1* | 6/2019 | Lhermet | B81B 3/0051 |
| 2020/0317505 A1* | 10/2020 | Rey | B81B 3/0051 |

FOREIGN PATENT DOCUMENTS

| | | | |
|---|---|---|---|
| FR | 2 977 319 A1 | 1/2013 | |
| FR | 2 983 844 A1 | 6/2013 | |

* cited by examiner

MECHANICAL LINK FOR MEMS AND NEMS MECHANICAL STRUCTURE, AND MEMS AND NEMS STRUCTURE COMPRISING SUCH A MECHANICAL LINK

CROSS-REFERENCE TO RELATED APPLICATIONS

This application claims priority to foreign French patent application No. FR 1908130, filed on Jul. 18, 2019, the disclosure of which is incorporated by reference in its entirety.

FIELD OF THE INVENTION

The present invention lies within the field of the structures and sensors that use "MEMS" (MicroElectroMechanical Systems) and/or "NEMS" (NanoElectroMechanical Systems) technologies. The structures and the sensors that use the two technologies will be designated throughout the description as "MEMS-NEMS structures" and "MEMS-NEMS sensors".

More specifically, the invention relates to a mechanical link for MEMS-NEMS structures or MEMS-NEMS sensors which use the detection of a movement (displacement or deformation) of a mobile component relative to a fixed component (generally a substrate), said movement being transmitted to a detector (strain gauge, capacitor, resonator, etc.) which allows it to be measured.

Such MEMS-NEMS sensors can for example be gyrometers, accelerometers, pressure sensors, magnetometers, microphones, etc.

BACKGROUND

In the field of MEMS-NEMS sensors, there are sensors based on a lever arm system, the principle of which is to transmit a force amplified by the lever arm to a detector which allows it to be measured. The lever arm is connected to the detector and, on the other side, it is linked to a mobile part (or it is a mobile component of a mobile part), whose movement is to be measured. The lever arm is connected to the motion detector generally via a pivot link, for example a hinge. Such a lever arm system also makes it possible to perform a differential measurement. For that, two motion detectors are used, disposed shrewdly relative to the axis of rotation of the lever arm.

The movement to be measured can be out of the plane of the substrate. In this case, the term "out-of-plane" movement applies. The movement to be measured can alternatively be in the plane of the substrate.

In the out-of-plane case, the lever arm can advantageously make it possible to transform an out-of-plane rotational movement into an in-plane rotational movement measured by the motion detector, as described for example in the patent application FR2941533 which relates to a sensor of accelerometer type making it possible to detect an out-of-plane effort applied to a mechanical mass, the out-of-plane movement is transmitted by the mass to one or more suspended strain gauges. The strain gauges can for example be of the piezoresistive gauge type.

Still in the out-of-plane case, the patent application FR2983844 relates to a pivot-forming mechanical link for an MEMS-NEMS structure, the pivot link being disposed between two components, a mobile component capable of pivoting relative to a fixed component, and comprising a torsion beam along the axis of the pivot link and a bending beam also along the axis of the pivot link. Such an MEMS-NEMS structure can be implemented in a gyrometer or an accelerometer by using the mobile component as detection means, the latter being set in motion by a Coriolis force or an acceleration respectively. Strain gauges are incorporated in the structure in order to detect the movement of the mobile component. The strain gauges are disposed at right angles to the axis of rotation of the pivot link and they are also disposed to obtain a differential reading.

Such a structure is illustrated in FIG. 1, which shows a structure S for an accelerometer comprising a fixed component 2, for example a substrate, a mobile component 4 suspended relative to the fixed component 2 and a pivot link 7 of axis Y linking the fixed component 2 and the mobile component 4.

The pivot link 7 comprises two first beams 3.1, 3.2 that are aligned with the pivot axis Y, linked by each of their ends to the fixed component 2 and to the mobile component 4, and working by torsion about the axis Y. The pivot link 7 also comprises two second beams 5.1, 5.2 disposed at right angles to the pivot axis Y, linking the fixed component 2 to the mobile component 4, and working by angular bending about the axis Y.

The structure S also comprises means for detecting the displacement of the mobile component 4 relative to the fixed component 2 which are formed by strain gauges 6. The two gauges 6 are each attached on one side or the other of the pivot axis Y, in order to obtain a differential reading.

Such a pivot link and a lever arm can be used for an MEMS-NEMS pressure sensor as described in the patent application FR2977319.

FIGS. 2A and 2B illustrate a pressure sensor comprising a substrate 2, a membrane 4 suspended on the substrate and capable of being deformed under the action of a pressure difference between its two faces, and strain gauges 6 gauging the deformation of the membrane that are fixed onto the substrate.

The membrane 4 is subjected on one of its faces 4.1 to the pressure P that is to be measured. The other face 4.2 is subjected to a reference pressure which is produced in a cavity 10 formed between the membrane and a cap 12 that is sealed on the substrate 2. In the case of an absolute pressure sensor, vacuum is produced in the cavity 10.

The sensor also comprises a lever arm 14 of longitudinal axis X capable of transmitting the deformation of the membrane 4 to the strain gauges 6. The lever arm 14 is coupled in displacement on Z to the membrane 4 and is mounted to be rotationally mobile on the axis of rotation Y relative to the substrate 2. By virtue of the lever arm, the strain seen by the gauges 6 (at their ends 6.1) is amplified relative to the force harvested by the membrane 4.

The rotation of the arm 14 about the axis of rotation Y is permitted by a pivot link formed by two beams 3 stressed in torsion about said axis of rotation Y. The two strain gauges 6 are attached to either side of the axis of rotation Y and of the arm 14. The torsion beams 3 can be replaced by bending beams or by a combination of bending and torsion beams, in so far as that makes it possible to produce a pivot link on the axis of rotation Y.

Anchoring blocks 20 fix the gauges 6 (at their ends 6.2) onto the substrate 2 and, on the anchoring blocks of the gauges, electrical contacts 22, 24 are formed. Anchoring blocks 19 link the beams 3 to the substrate 2 and allow the electrical polarization of the MEMS and of the mid-point of the two gauges.

When a pressure difference appears between the face 4.2 and the face 4.1 of the membrane, the membrane is deformed, either towards the interior of the cavity, or towards the outside of the cavity as a function of the value of the pressure to be measured relative to the reference pressure. This deformation induces a force on the lever arm 14 that is coupled strongly on Z with the membrane 4, which has the effect of generating a strain on the strain gauges 6. This strain is amplified by virtue of the lever arm 14 and of its pivoting about the axis of rotation Y. The strain undergone by the gauges 6 is then measured, for example by measuring the variation of the electrical resistance of the gauges in the case of piezoresistive gauges. These measurements then make it possible to determine the pressure difference seen by the membrane and the pressure of the environment.

In gauge configuration presented for the accelerometer or the pressure sensor, it is found that their differential behaviour is not perfect and that one gauge is more sensitive than the other. Now, one aim of the differential reading is to cancel the common errors between the two gauges upon the subtraction of the signals by the reading electronics; if the two gauges do not have the same sensitivity, the errors are no longer cancelled.

Overall, that can be explained by the lack of symmetry of the structure at the gauge level. On the one hand, when one gauge operates by stretching, the other operates by compression and vice-versa. Now, it is not easy to have a mechanical behaviour of the gauges that is symmetrical in compression and in tension. If such is not the case, the stiffnesses on each side of the lever arm are not the same, which can falsify its displacement and culminate in a compression strain on one gauge that is different from the tensile strain of the other. On the other hand, the lever arm, considered to be non-deformable, must transmit the efforts identically on each of the two gauges. Now, this hypothesis is not respected if one part of the arm which contacts one gauge is deformed relative to another part which contacts the other gauge. Typically, one part of the arm is larger to bypass and connect a gauge on the other side of the axis of rotation, unlike the other gauge, which is connected directly. If this part of the arm is deformed, the gauge connected directly will be more strained. Finally, an initial stress in the gauges, for example a stress due to the doping of the structure to make it conductive, can tend to rotate the lever arm in the plane and such an initial deformation could be sufficient to significantly disrupt the symmetrical behaviour of the structure.

In order to resolve this problem, one solution can be to dispose the gauges on the axis of symmetry of the structure, that is to say on the axis X in FIGS. 1, 2A and 2B.
This solution can be implemented by:
  aligning the gauges on the axis of symmetry X;
  separating the two gauges from the axis of rotation Y to leave space between them for a beam linked to the mobile component (or mobile mass);
  perforating the mass to insert the anchoring blocks of the two gauges therein.

This solution is represented in FIG. 3, which represents an accelerometer comprising a fixed substrate (not represented) and a mobile mass 4, as well as two torsion beams 3.1 and 3.2 and two bending beams 5.1 and 5.2 creating a pivot link on an axis of rotation Y. The accelerometer further comprises two strain gauges 6 disposed on the axis of symmetry X of the structure and on either side of the axis of rotation Y so as to leave space for the mobile mass 4. The gauges 6 are fixed to the substrate by anchoring blocks 20.

This solution provides many advantages, but it does however have limitations.

Firstly, gauges 6 positioned on the axis of symmetry but offset relative to the axis of rotation no longer work by pure angular bending. This issue can be understood by referring to FIGS. 4A, 4B and 4C, which represent the cross section of a gauge 6 attached on one side to an anchoring block 20 and on the other side to the mobile component 4, whose movement it measures. Since the mobile component (lever arm, mass, etc.) is driven by an out-of-plane rotational movement Z about a direction of rotation Y at right angles to Z, each gauge undergoes an angular bending through its link with said mobile component, and this is in addition to the compression and/or the tension sought. FIGS. 4A, 4B and 4C show that, when the gauge is centred on the axis of rotation (FIG. 4A), its deformation, outside of the compression sought, is a pure angular bending. On the other hand, when the gauges are set off-centre (FIGS. 4B and 4C), notably to allow space for the central mass, the deformation of the gauge is made more complex by adding an unwanted out-of-plane bending. The case of FIG. 3 corresponds to the positioning of FIG. 4C. This spurious movement will induce additional strains which create no useful signal and which can embrittle the gauge, notably in the case of impacts. To reduce the spurious movement, separation of the gauges must be minimized. However, it is necessary to retain a minimum central mass width for it to be sufficiently rigid in order to transmit the movement from said mobile central mass to the gauges. So there is, there, a contradiction which is generally solved by a compromise.

Secondly, this solution requires disposing the gauge anchoring blocks at the central level of the structure, at least as close as possible to the mobile component. This is generally not possible, notably for a pressure sensor. It can be understood from FIG. 2C, which represents a pressure sensor structure in which the pivot link is formed by two bending beams 5.1, 5.2 and two torsion beams 3.1, 3.2, there would be no space left for anchoring blocks 20 of gauges 6 if they were to be moved to the axis of symmetry X where the contacts 21 of the membrane 4 are already disposed.

Finally, in the case of a detection by resonance beam, the necessary number of contacts is even greater. The resonant detection requires more active elements and therefore more contacts for these active elements: indeed, instead of directly compressing a piezoresistive gauge, a resonant beam is compressed, that is excited (an active element and therefore at least one or even two contacts) on its first deformation mode, and that is measured by virtue of one or two piezoresistive gauges (generally requiring three contacts). A detection by resonance beam can necessitate at least five contacts, and at the centre of the structure. For a differential measurement, two resonance beams, and therefore at least ten contacts, are needed. It is therefore even less easy to dispose these gauges and their contacts at the centre of the structure.

These drawbacks appear also in the sensors with in-plane detection, like the accelerometer of MEMS and/or NEMS type with in-plane displacement described in the patent application FR2951826.

Such an accelerometer is represented in FIG. 5. The accelerometer comprises a lever arm-forming mass 4, including a finer part 41, held on a substrate by two mutually orthogonal bending beams 5.1, 5.2 forming a hinge whose axis of rotation is at the intersection of the two beams. The beams are fixed to the substrate by an anchoring block 19. The low bending stiffness of the beams allows the in-plane rotation of the substrate OXY, the axis of rotation Z being at right angles to said plane. Moreover, the beams block the other in-plane displacements by their strong compression stiffness, and they block the out-of-plane movements by their strong out-of-plane bending stiffness. Two strain gauges 6 are placed in proximity to the centre of rotation R to obtain a high amplification factor on the lever arm. The gauges are fixed to the substrate by an anchoring block 20. The first problem stated above in association with FIGS. 4A, 4B, 4C arises once again. Indeed, to obtain a pure angular bending in addition to the desired compression, the gauges should be centred on the axis X. Thus, it would be necessary to limit their separation, while retaining a fairly rigid lever arm, hence the compromise which dimensions the width of the mass between the two gauges.

Furthermore, the issue of missing space for the anchoring blocks can also arise, notably if the detection is performed using a resonant beam (and a fortiori using several resonant beams).

SUMMARY OF THE INVENTION

The invention aims to overcome the abovementioned drawbacks of the prior art.

More particularly, it aims to provide an MEMS and/or NEMS structure, notably to produce a sensor, which makes it possible to avoid spurious strains on a strain gauge, a resonant beam (or any motion detector likely to undergo such a strain), notably to improve the differential measurement, without necessarily needing to enlarge the structure.

A solution that makes it possible to remedy these drawbacks relates to a mechanical link and a structure and a sensor comprising such a mechanical link.

A first object of the invention relates to a mechanical link for a microelectromechanical and/or nanoelectromechanical structure, said structure comprising a mobile component, a fixed component extending on a main plane and means for detecting the displacement of the mobile component relative to the fixed component, said mechanical link comprising:
 a first link linked to the fixed component and to the mobile component and capable of allowing the rotation of said mobile component relative to said fixed component about an axis of rotation;
 a second link connecting the mobile component to the detection means at a given distance relative to the axis of rotation in a direction at right angles to said axis of rotation;
 a third link linked to the fixed component and to the detection means and configured to guide said detection means in translation in a direction of translation in the main plane of the fixed component;
such that the combination of the second link and of the third link is capable of transforming the rotational movement of the mobile component into a translational movement of the detection means in the direction of translation.

According to the invention, the "main plane" denotes the reference plane of the microelectromechanical and/or nanoelectromechanical structure, and is generally designated "OXY" in the description. In the interests of simplicity, the term "plane" denotes the main plane. Planes other than the main plane will be denoted differently. The term "out-of-plane" is with reference to said main plane.

The terms "thickness", "thick", "thinness", "thin" are given for dimensions at right angles to the plane of the substrate.

The terms "fine", "fineness", "wide", "width", "elongate", "elongation", "length", "long" are given for dimensions in the plane of the substrate (or in a plane parallel to the plane of the substrate). In the present description, the length designates the dimension in the direction X and the width designates the dimension in the direction Y.

The terms "mobile" and "fixed" refer to the relative movement of one component relative to the other. The movement can be a displacement or a deformation. Thus, according to the invention, the term "mobile" defines a component that can be displaced or deformed.

According to one embodiment, the mechanical link further comprises a transmission component linked to the detection means, the second link being linked to the mobile component and to the transmission component. In this case, the combination of the second link and of the third link is capable of transforming the rotational movement of the mobile component into a translational movement of the transmission component in the direction of translation, said transmission component transmitting the translational movement to the detection means.

According to a first variant embodiment, the first link is an out-of-plane pivot link relative to the main plane of the fixed component, that is to say allowing an out-of-plane rotation. In particular, it comprises at least one first blade intended to work by torsion about an axis of rotation and/or at least one second blade intended to work by bending about the axis of rotation, each of the first and second blades being linked on one side to the mobile component, and on the other side to the fixed component, for example using at least one anchoring block.

According to one embodiment of the first variant, the first blade is a thick blade.

According to one embodiment of the first variant, the second blade is a thin blade. Alternatively, the second blade is a thick blade.

According to one embodiment of the first variant, the second link comprises a thick out-of-plane bending blade extending in the direction of translation. Alternatively, the second link comprises at least one thin out-of-plane bending blade extending in the direction of translation.

According to a second variant embodiment, the first link is a pivot link in the main plane of the fixed component, that is to say allowing an in-plane rotation. In particular, it can comprise at least two thick in-plane bending blades that are non-colinear and configured so that the intersection of said thick blades forms an in-plane pivot link on an axis of rotation at right angles to the plane of the substrate.

According to a particular embodiment of the second variant, the second link comprises a thick in-plane bending blade extending in the direction of translation.

According to an embodiment in which the mechanical link comprises a transmission component linked to the detection means, the transmission component is formed by a thick frame, for example a frame with rectangular or square base formed by four thick beams linked to one another along their thickness.

According to a particular embodiment, the transmission component further comprises a central beam extending in the direction of rotation and disposed substantially in the middle of the thick frame.

According to one embodiment, the third link comprises at least one thick in-plane bending blade, fine in the direction of translation and linked on one side to the detection means or to the transmission component and on the other side to the fixed component, for example by at least one anchoring block.

According to an alternative embodiment, the third link comprises at least one double thick in-plane bending blade, said thick double blade comprising a first thick blade linked to the detection means or to the transmission component, a second thick blade linked to the fixed component, for example by at least one anchoring block and an intermediate link component linking the first and second thick blades.

A second object of the invention relates to a microelectromechanical and/or nanoelectromechanical structure comprising a mobile component, a fixed component extending on a main plane, means for detecting the displacement of the mobile component relative to the fixed component and a mechanical link according to the first object of the invention, said mechanical link being configured to link the mobile component and the detection means, said detection means being disposed so as to measure the translational displacement in the direction of translation.

According to one embodiment, the detection means comprise at least one strain gauge of piezoresistive or piezoelectric type, a resonance beam, a capacitance or a combination of said means.

According to a particular embodiment, the detection means comprise two strain gauges.

According to one embodiment, the mechanical link of the structure comprises a transmission component linked to the detection means, the second link of the mechanical link being linked to the mobile component of the structure and to said transmission component.

The transmission component can be formed by a thick frame, for example a frame with a rectangular or square base formed by four thick beams linked to one another along their thickness.

According to a particular embodiment, the detection means are disposed inside the transmission component.

In the case where the transmission component is formed by a thick frame and also comprises a central beam extending in the direction of rotation and disposed substantially in the middle of the thick frame, the detection means, for example two gauges, can be disposed on either side of the central beam.

A third object of the invention relates to a device for measuring a pressure variation comprising a microelectromechanical and/or nanoelectromechanical structure according to the second object of the invention and a membrane or a piston linked to a lever arm forming the mobile component.

A fourth object of the invention relates to an accelerometer comprising a microelectromechanical and/or nanoelectromechanical structure according to the second object of the invention and a mass forming the mobile component or a lever arm forming the mobile component.

BRIEF DESCRIPTION OF THE DRAWINGS

Other features and advantages of the invention will become apparent from the following description, given in an illustrative and nonlimiting manner, in light of the attached figures, in which.

DETAILED DESCRIPTION

Throughout the present detailed description, the main plane (or "plane") is designated by the reference OXY and corresponds generally to the plane of the fixed component, which is the substrate on which the MEMS-NEMS structure is fabricated. The out-of-plane direction is represented by the direction Z. The in plane direction of translation is represented by the direction X.

Throughout the present detailed description, elements that fulfil the same functions and that are produced in a structurally similar manner are designated by one and the same reference. The elements that fulfil the same functions but are produced in a structurally different manner are designated by different references.

FIGS. 1, 2A, 2B, 2C, 3, 4A, 4B, 4C and 5 have been described previously and will not be returned to here.

The invention consists in transforming a rotational movement (out-of-plane or in the plane of the fixed component, for example of the substrate) of a mobile component (lever arm, mass, etc.) into a translational movement in the plane of the fixed component. Said mobile component can be itself made mobile by another component by displacement (such as a piston) and/or by deformation (such as a membrane). This translational movement obtained is detected by a strain gauge, a resonator, a capacitance of a capacitor, etc. (more broadly, a motion detector). That notably makes it possible to eliminate spurious constraints on the detector and can make it possible to offset said detector if necessary. That also makes it possible to improve the differential measurement and notably the symmetry of the differential measurement.

Figure 6:
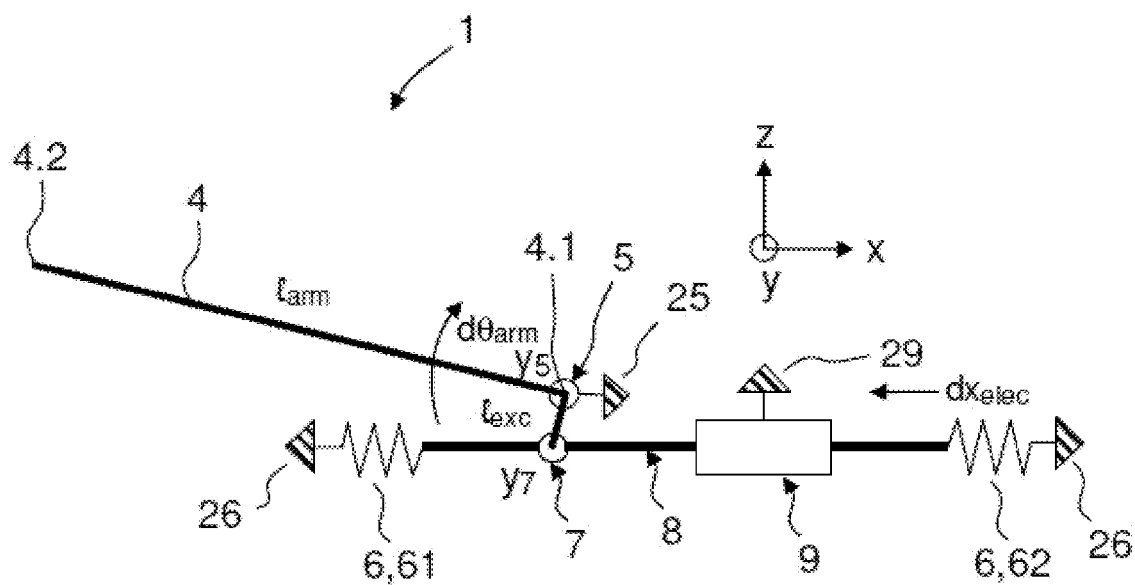
FIG. 6 schematically represents a mechanical link according to the invention.

FIG. 6 schematically represents a mechanical link according to the invention in the case where the mobile component is driven by an out-of-plane rotational movement about a direction of rotation Y and in which the mechanical link transforms it into a translational movement in the plane OXY in a direction of translation X. FIG. 6 schematically represents a mechanical link also in the case where the mechanical link comprises a transmission component.

The mechanical link 1 schematically represented links the mobile component 4 to the detection means 6. FIG. 6 illustrates the case where the detection means 6 comprise two strain gauges 61, 62, one operating by compression when the other operates by tension, and vice-versa. Each strain gauge 61, 62 is fixed to a substrate (not represented) by an anchoring means 26. The mobile component 4 is, for example, a transmission arm or lever arm. The substrate extends in the plane OXY.

The mechanical link 1 comprises a first link 5 (or pivot link) which is linked to the mobile component 4 at its first end 4.1. The first pivot link 5 is fixed to the substrate by an anchoring means 25. The first pivot link 5 allows a rotation of the mobile component 4 about an axis of rotation Y5, that is to say an out-of-plane rotation relative to the substrate. The mobile component 4 rotates under the effect of a force in the direction Z applied at its second end, or free end, 4.2. This force can be of inertial origin in the case of an accelerometer or derive from the difference in pressure on the surfaces of a membrane for a pressure sensor, or even under the effect of a magnetic field for a magnetometer, etc.

The mechanical link further comprises a second link 7 associated with the first link 5 and linked to the mobile component 4. The second link 7 allows a bending on an axis of bending Y7 which follows the same direction Y as the axis of rotation Y5, but which is offset by a distance $l_{exc}$ in the out-of-plane direction Z. Moreover, it ensures a strong coupling in the direction of translation X between the mobile component 4 and a transmission component 8 described hereinbelow.

The mechanical link represented further comprises a transmission component 8 linked to the second link 7, and a third link 9 of slide link type capable of guiding the transmission component 8 that is translationally mobile in the plane OXY (in the direction of translation X). The slide link 9 is fixed to the substrate by an anchoring means 29. The offset in the direction Z of the second link 7 combined with the link of slide type 9 means that the out-of-plane movement of the mobile component 4 is transformed into a translation in the direction of translation X of the transmission component 8, therefore in the plane OXY of the substrate. The second link 7, to avoid rendering the system hyperstatic at the component 8 upon its combination with the slide link 9 must be able to transmit a translation to the transmission component 8 in the direction of translation X while allowing a rotation of the mobile component 4 about the direction of rotation Y. It must therefore allow a slight displacement in the direction Z. This second link can be called "coupling link".

The mobile transmission component 8 is linked to each of the two strain gauges 61, 62 so as to transmit to them a compression and/or tension force. Since the transmission component 8 is translationally mobile in the plane, the gauges undergo only a pure compression or a pure tension, without spurious deformation. Thus, the position of the gauges is inconsequential. There is notably no longer any space constraint for the positioning of the gauge anchoring blocks.

The second link can be linked directly to the detection means, that is to say without a transmission component, and thus transmit the translation directly to the detection means, more specifically to at least one mobile component of said detection means. And in this case, the third link of slide link type is configured to guide said mobile component of the detection means in the in-plane direction of translation.

In the case of a mechanical link that makes it possible to transform an in-plane rotational movement into an in-plane translational movement, the axis of rotation is in a direction at right angles to the plane. For example, the axis of rotation is then in the direction Z. In other words, the mobile component rotates about the direction Z at right angles to the plane OXY, the mobile component and the mechanical link are then seen in the plane OXY.

FIGS. 7A to 7D represent different views of a sensor (accelerometer with out-of-plane detection) according to a first embodiment. The shaded arrows indicate the directions of coupling of the links and the white arrows indicate the flexible directions of the links.

Figure 7A:
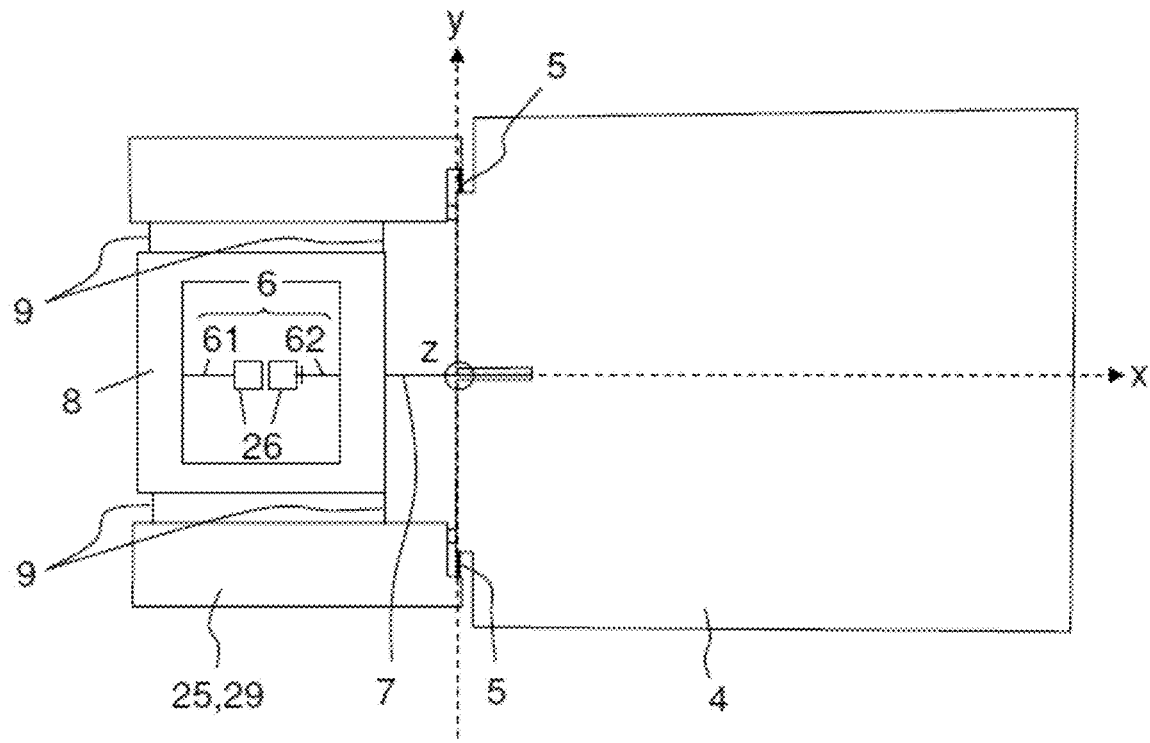
FIGS. 7A-7D represent different views of a sensor (accelerometer with out-of-plane detection) according to a first embodiment.
Figure 7B:
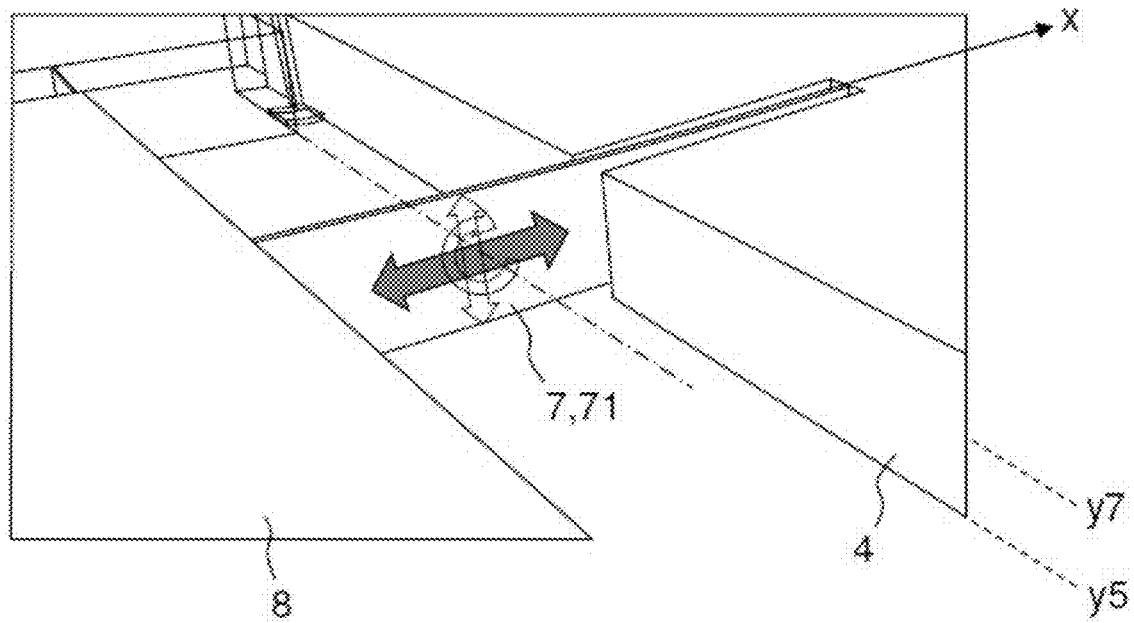
Figure 7C:
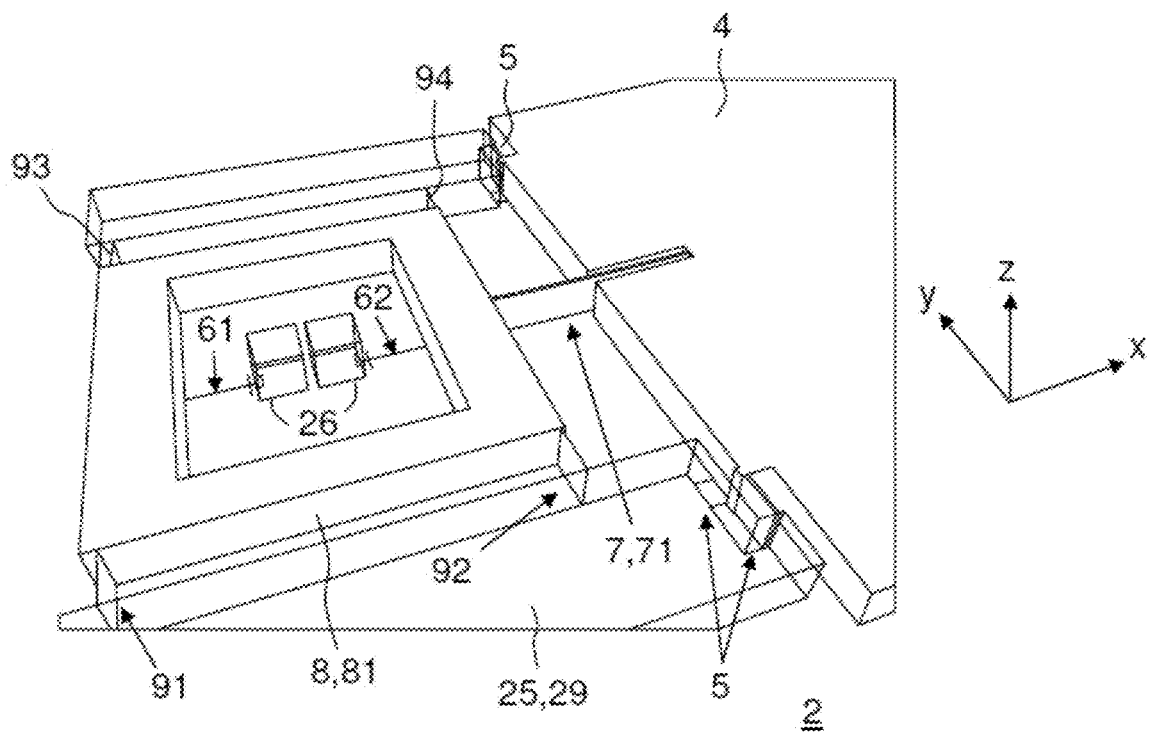
Figure 7D:
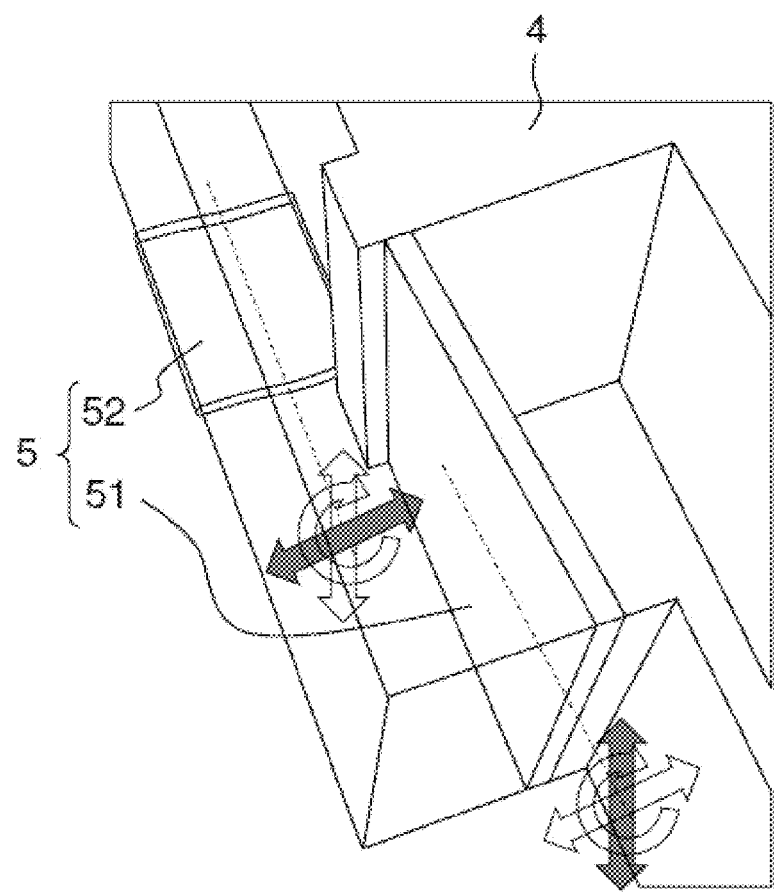

The first link 5 is formed by two thick torsion blades 51 and two thin out-of-plane bending blades 52 (detail in FIG. 7D). Each blade is linked on the one hand to a mobile mass 4, forming the mobile component, and on the other hand to a substrate 2, forming the fixed component, by an anchoring block 25. The substrate 2 extends in the plane OXY (main plane). The torsion blades 51, etched in the thick layer, block the out-of-plane translation by virtue of their strong bending stiffness on Z and their anchoring, while exhibiting a weak angular stiffness by virtue of their short length in the direction X, allowing a torsion about the direction Y. The out-of-plane bending blades 52, etched in the thin layer, block any in-plane translation by virtue of their strong compression stiffness in the direction X, their strong compression stiffness on Y and their anchoring, while exhibiting a weak angular stiffness by virtue of their small thickness, allowing an out-of-plane bending about the direction Y. The combination of the two thick torsion blades 51 and two thin bending blades 52 thus blocks the out-of-plane and in-plane translations, while allowing an out-of-plane rotation, more specifically about the direction Y. The axis of rotation Y5 is thus defined on the basis of the thick layer (MEMS) of the torsion blades 51, at the intersection of the core of the thin layer (NEMS) of the bending blades 52 and of the core of the thick layer (MEMS) of the torsion blades 51. The first pivot link 5 allows a rotation of the mass 4 about the axis of rotation Y5, therefore an out-of-plane rotation relative to the substrate 2.

The mobile component can alternatively be formed by a lever arm (not represented in FIGS. 7A to 7D) which can be a finer part of the mobile mass or a component different from the mobile mass but linked to said mass so as to transmit and amplify the movement of said mobile mass.

The coupling link 7 adapted to transform the rotational movement of the mass 4 into a translational movement to the transmission component 8 consists of a thick out-of-plane bending blade 71 linked on the one hand to the mass 4 and on the other hand to the transmission component 8. The strong stiffness in compression in the direction X of this thick blade (detail in FIG. 7B) makes it possible to strongly couple the in-plane movement of the mass 4 to the middle of said blade and of the transmission component 8. Even if the thick bending blade 71 has a strong thickness, it allows a rotation by bending about the direction Y and thus a small out-of-plane movement which make it possible to have the rotation of the mass 4 and the translation of the transmission component 8 coexist.

Advantageously, the coupling blade 7 is centred above (in the direction Z) the axis of rotation Y5 of the mass 4 to approximate as closely as possible a pure angular bending and minimize the stiffness of the link. As was seen for the bendings of the gauges in FIGS. 4A to 4C, centring a beam to cause bending about the axis of rotation makes it possible to limit its deformation to a pure angular bending. It is therefore in this configuration that the coupling blade will oppose the least stiffness.

This blade can be modelled by a diagonal stiffness matrix at its centre, therefore in the middle of the MEMS layer. Since the axis of bending Y7 of the coupling link 7 appears in the middle of the MEMS thickness, here above the axis of rotation Y5, the necessary eccentricity is indeed obtained between the first and second links. The thick out-of-plane bending blade forming the coupling link 7 can therefore be seen as a connecting rod connected between the mass 4 and the transmission component 8.

The transmission component 8 illustrated is formed by a rectangular frame 81, which can in particular be square, formed by four thick blades linked to one another along their thicknesses.

The mobile transmission component 8 is linked to two strain gauges 61, 62 in a configuration such that it can transmit to one a compression force while it transmits to the other a tension force, and vice-versa.

In the example illustrated, referring notably to FIGS. 7A and 7C, the strain gauges 61, 62 are disposed inside the rectangular frame 81 forming the transmission component and are disposed on the direction of translation X (which is also the axis of symmetry of the structure) in said frame symmetrically relative to the direction Y. Thus, the strain gauges are connected with the two opposing sides of the rectangular frame in the direction X. Moreover, the strain gauges are linked to the substrate 2 by anchoring blocks 26 disposed inside the rectangular frame.

The transmission component 8 is held in in-plane translation by at least two thick in-plane bending blades 91, 92 anchored to the substrate by at least one anchoring block 29, the blades forming the third link or slide link 9. These blades exhibit a strong out-of-plane stiffness, due to their great thickness and their anchoring. Furthermore, their strong stiffness in compression due to their great width in the direction Y makes it possible to block the translation in this direction Y. Finally, their short length in the direction X generates a weak stiffness in that direction X. That makes it possible to guide the translation of the transmission component 8 in the direction X.

The coupling link 7 combined with the slide link 9 makes it possible to transform the rotation of the mass 4 about the direction Y into a translation of the transmission component 8 in the direction X.

Since the transmission component 8 is mobile in in-plane translation (in the direction X), the strain gauges undergo only a pure compression or a pure tension, without spurious deformation. Thus, the position of the gauges is inconsequential. There is notably no more space constraint for the positioning of the anchoring blocks of the gauges since the latter can be offset.

According to an advantageous embodiment, at least three thick bending blades 91, 92, 93 form the slide link 9, which makes it possible to block any rotation in the plane OXY. Alternatively, two thick blades sufficiently far apart from one another in the direction X are sufficient to block the rotation in the plane OXY. In the embodiment illustrated, there are four thick bending blades 91, 92, 93, 94, which makes it possible to improve the symmetry.

Figure 8:
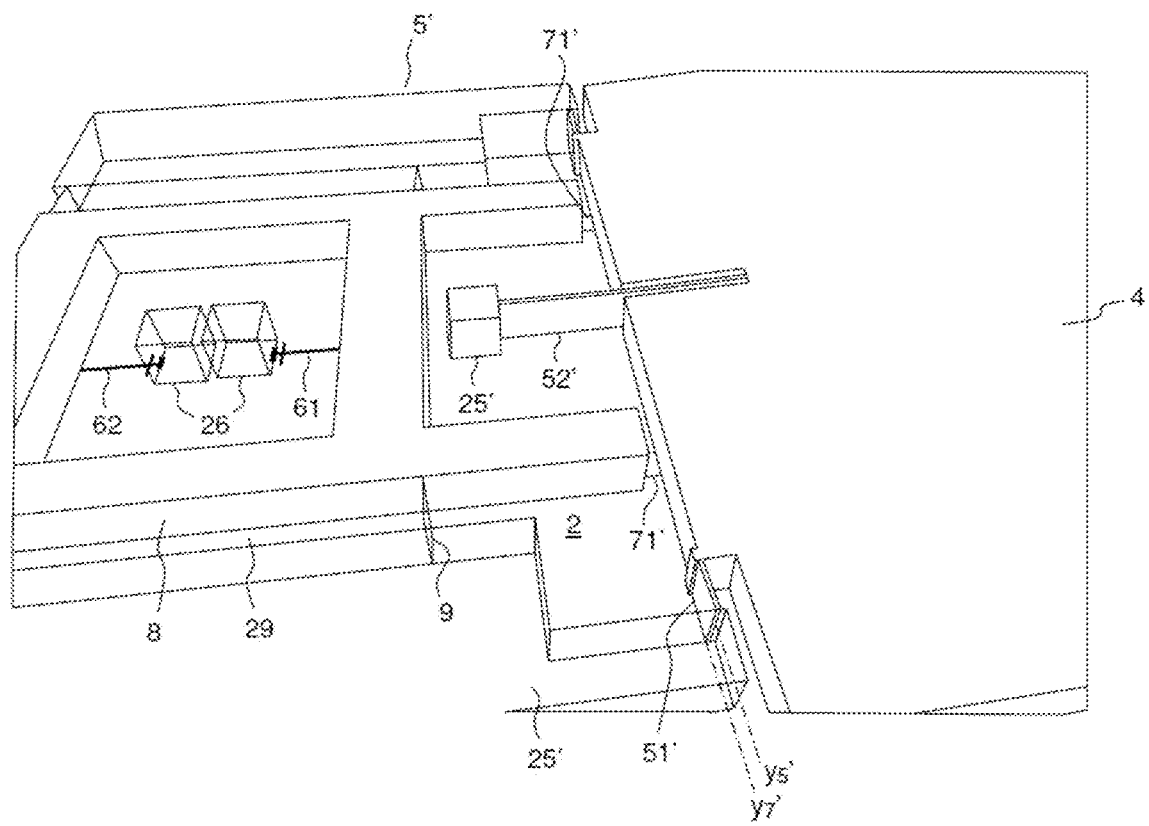
FIG. 8 represents a variant of a mechanical link for an accelerometer with out-of-plane detection according to the first embodiment.

According to a variant of the first embodiment illustrated in FIG. 8, that can be applied to another structure according to the invention, the first pivot link 5' can be formed by two thick torsion blades 51' of the type of those illustrated in FIG. 7D (reference 51) and at least one thick out-of-plane bending blade 52' of the type of that illustrated in FIG. 7B (reference 71). In this case, the thick out-of-plane bending blade 52' is linked to the substrate 2 by an anchoring block 25' and not to the transmission component 8. The thick out-of-plane bending blade 52' is linked on the other hand to the mass 4. The axis of rotation Y5' is then in the middle of the thick MEMS layer (and no longer at the foot of the thick layer, i.e. no longer at the heart of the thin NEMS layer). Moreover, the second link or coupling link 7' is then formed by thin out-of-plane bending blades 71' of the type of those illustrated in FIG. 7D (reference 52). The latter, instead of being linked to anchoring blocks, are linked to the transmission component 8. The axis of bending Y7' of the coupling link 7 is then at the core of the thin NEMS layer, that is to say at the foot of the thick MEMS layer and it is below the axis of rotation Y5'.

Figure 9:
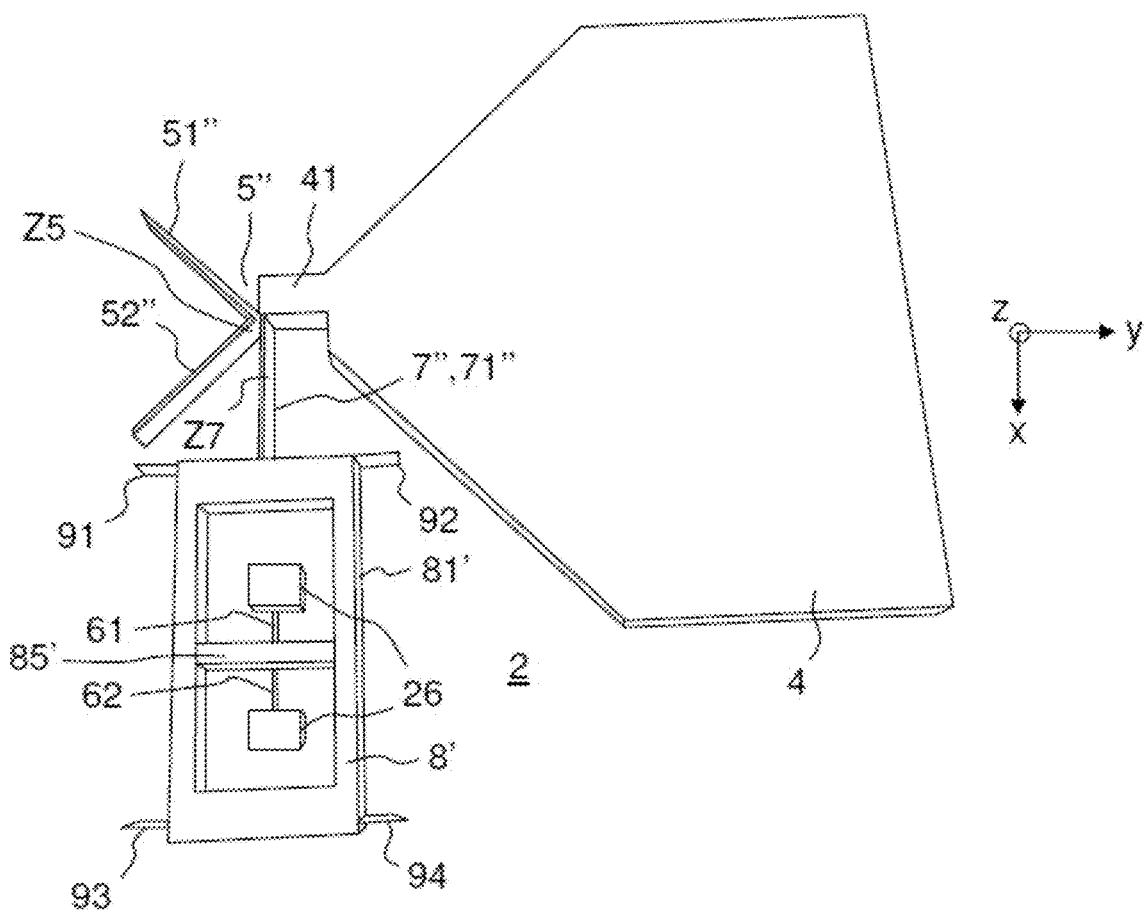
FIG. 9 represents a sensor (accelerometer with in-plane detection) according to a second embodiment.

FIG. 9 represents a sensor (accelerometer with in-plane detection) according to a second embodiment.

Figure 1:
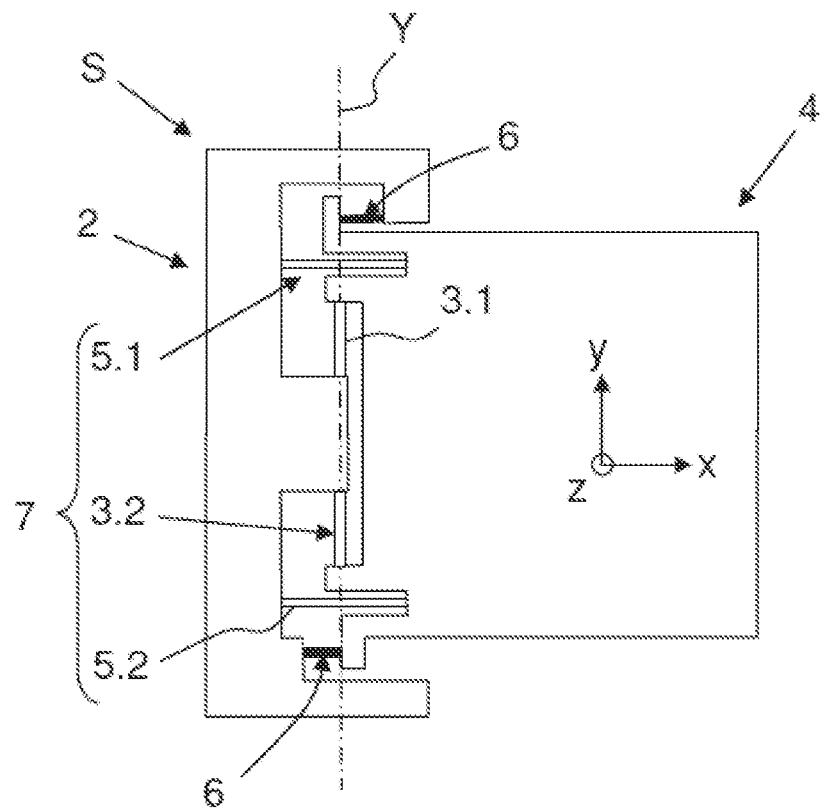
FIG. 1 represents an accelerometer with out-of-plane detection of the prior art.
Figure 2A:
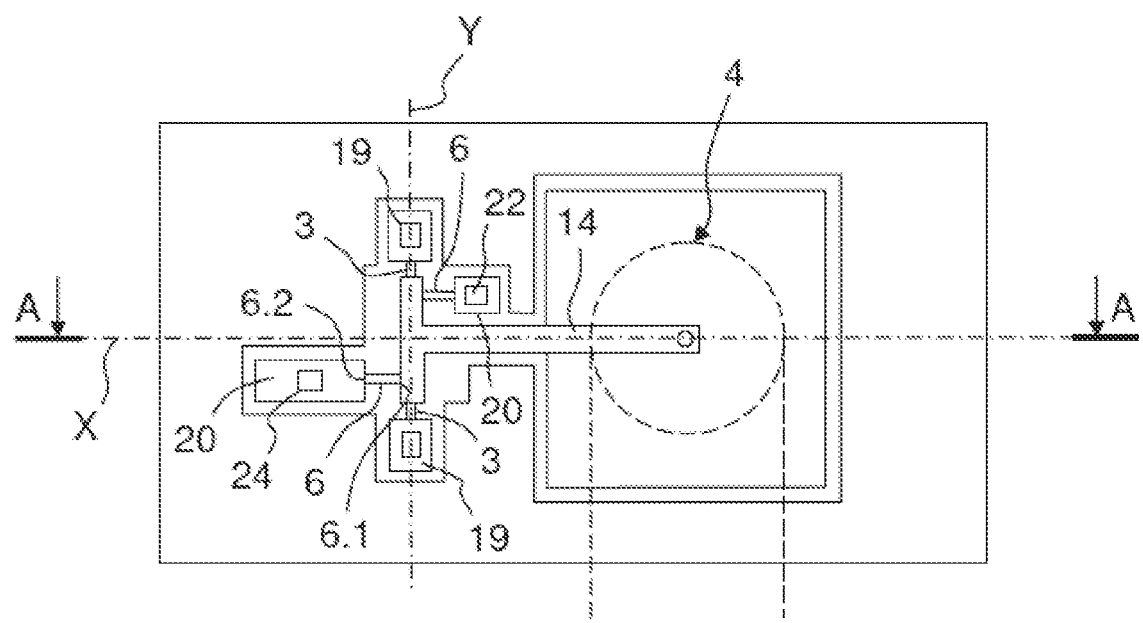
FIGS. 2A-2C represent two pressure sensors of the prior art.
Figure 2B:
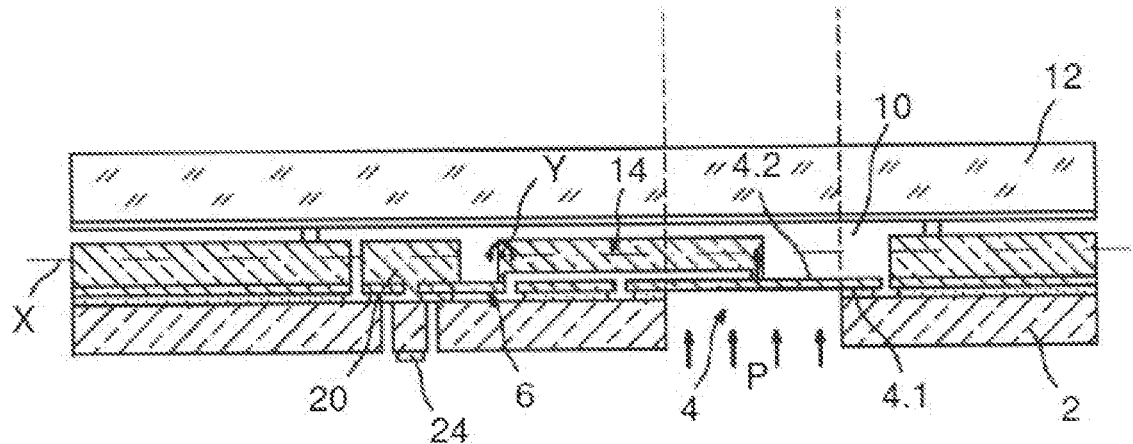
Figure 2C:
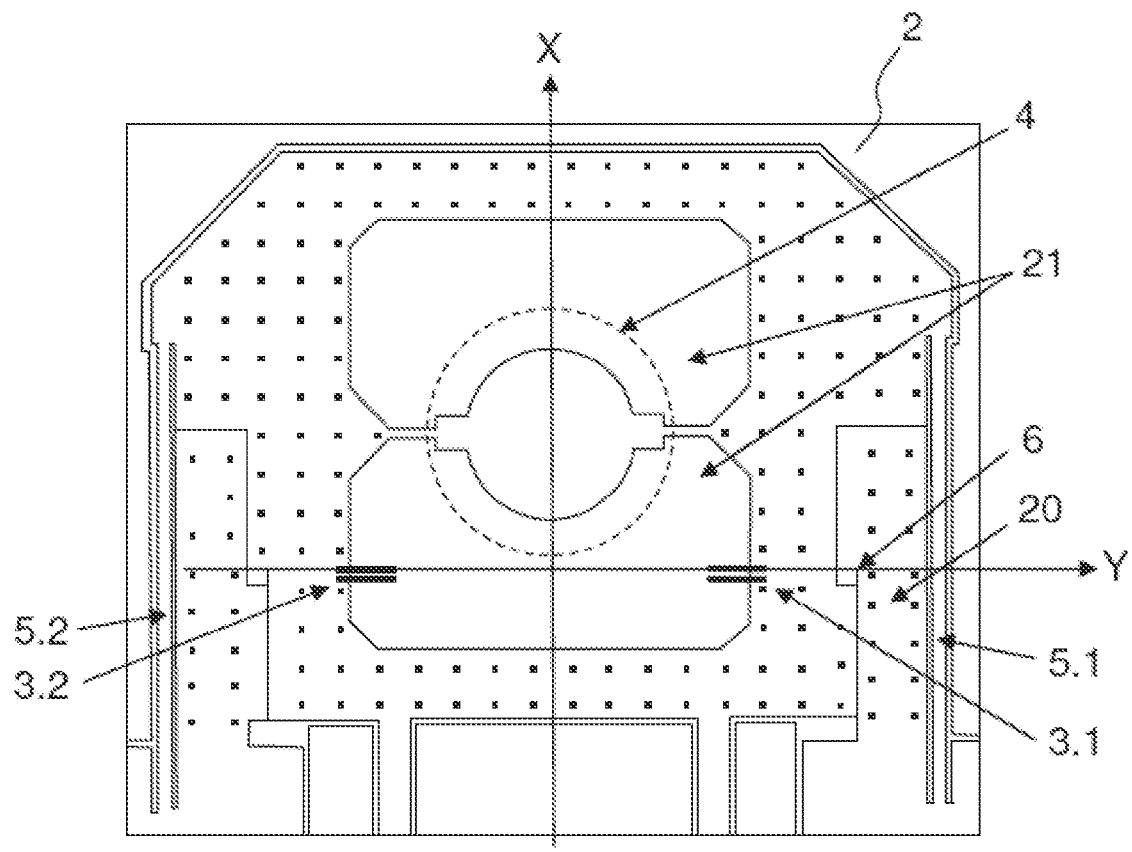
Figure 3:
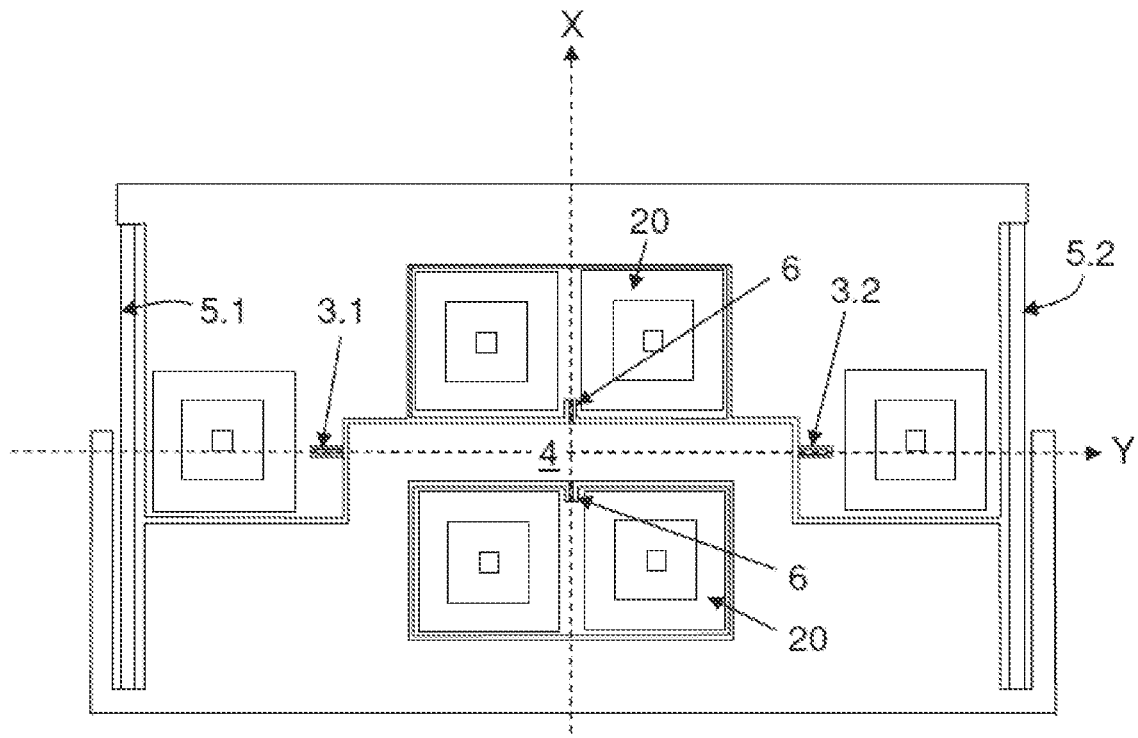
FIG. 3 represents a sensor in which the strain gauges are disposed on the axis of symmetry.
Figure 4A:
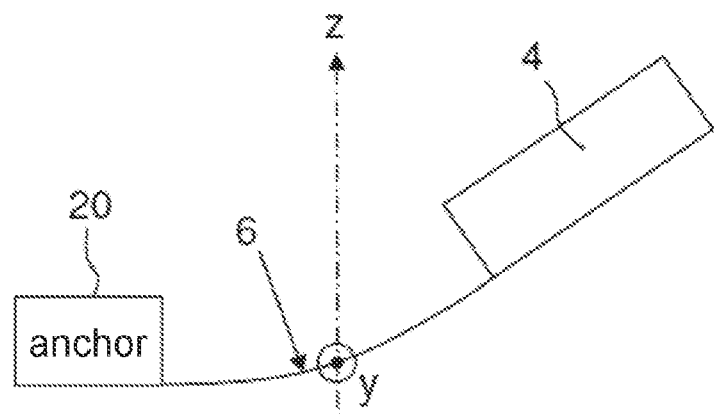
FIG. 4A illustrates a strain gauge in pure bending configuration.
Figure 4B:
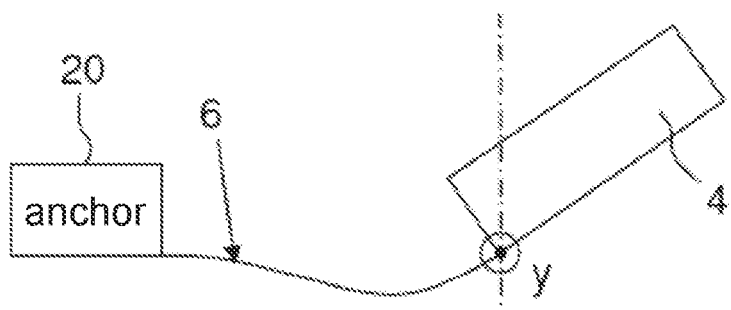
FIGS. 4B-4C illustrate a strain gauge in two non-pure bending configurations.
Figure 4C:
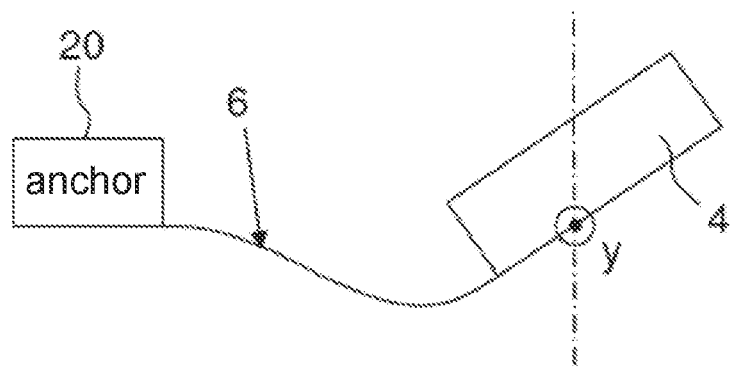
Figure 5:
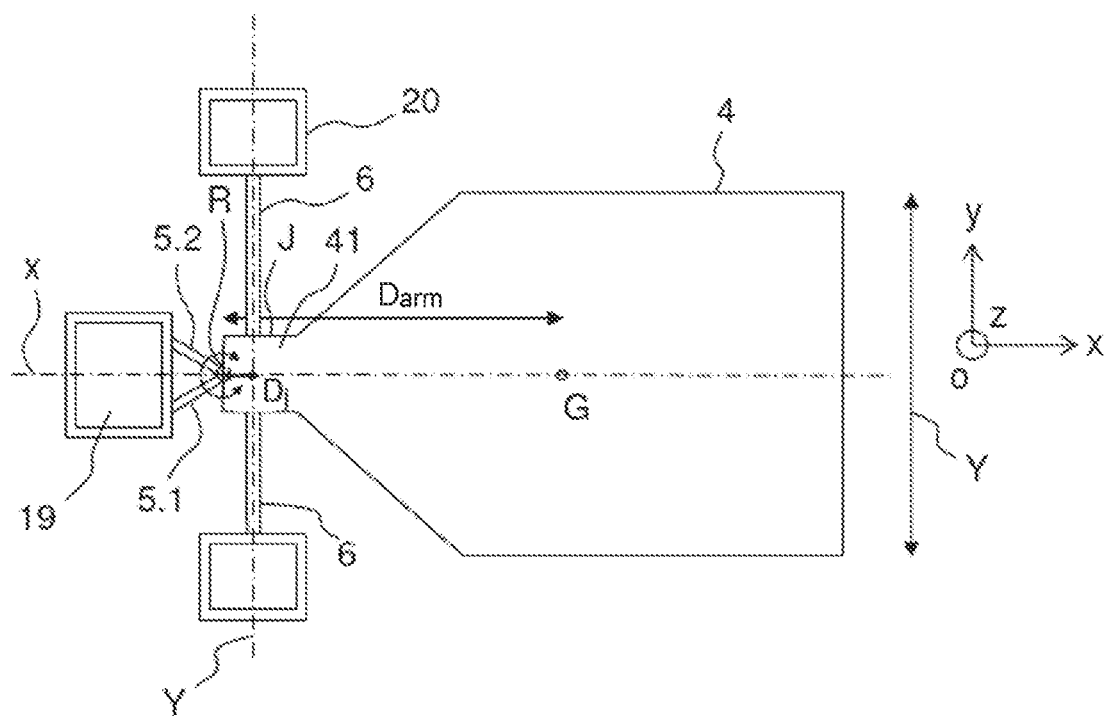
FIG. 5 represents an accelerometer with in-plane detection of the prior art.

As for the accelerometer of the state of the art illustrated in FIG. 5, the accelerometer comprises a mass 4 forming a lever arm and comprising an end 41. At said end, the mass is held to a substrate 2 by two thick mutually orthogonal bending blades 51", 52", the intersection of the two thick blades forming the axis of rotation Z5 of the first pivot link 5", which is in the direction Z at right angles to the plane of the substrate OXY. Thus, the mass 4 describes a rotational movement in said plane about said axis of rotation Z5. As for the out-of-plane accelerometer, the second link or coupling link 7" is formed by a thick bending blade 71" that is elongate in the direction X and thin in the direction Y. However, contrary to the out-of-plane accelerometer, it allows an in-plane bending, about an axis of bending Z7 which follows the same direction as the axis of rotation Z5, but it is offset in the direction X. The thick bending blade 71" is linked to a transmission component 8'.

The transmission component 8' is held in in-plane translation by at least two thick in-plane bending blades 91, 92, fixed to the substrate by at least one anchoring block 29, the blades forming the third link or slide link 9 in the same way as for the out-of-plane accelerometer. These blades exhibit a strong out-of-plane stiffness, due to their great thickness. Furthermore, their strong stiffness in compression in the direction Y makes it possible to block the translation in that direction Y. Finally, their short length in the direction X generates a weak stiffness in that direction X. That makes it possible to guide the translation of the transmission component 8' in the direction X.

According to an advantageous embodiment, at least three thick bending blades 91, 92, 93 form the slide link 9, which makes it possible to block any rotation in the plane OXY. Alternatively, two thick blades sufficiently far apart from one another in the direction X are sufficient to block the rotation in the plane OXY. In the embodiment illustrated, there are four thick bending blades 91, 92, 93, 94, which makes it possible to improve the symmetry.

The coupling link 7" combined with the slide link 9 makes it possible to transform the in-plane rotation of the mass 4 about the direction Z into a translation of the transmission component 8' in the direction X.

The transmission component 8' comprises a central beam 85' extending in the direction Y and linked to two strain gauges 61, 62 disposed on either side of said central beam so as to transmit to one of them a compression force while the other receives a tension force, and vice-versa. The strain gauges are linked to the substrate 2 by anchoring blocks 26. Since the transmission component 8' is mobile in in-plane translation, the strain gauges no longer undergo a rotation but a pure compression or a pure tension, therefore without spurious deformation. Thus, the position of the gauges is inconsequential. There is notably no more space constraint for the positioning of the anchoring blocks of the gauges.

This variant of the transmission component with a central beam and strain gauges disposed on either side of said central beam can be applied to other MEMS-NEMS structures, notably the structure for an out-of-plane accelerometer of FIGS. 7A to 7D.

Likewise, the variant of the transmission component without a central beam as illustrated in FIGS. 7A and 7C can be applied to MEMS-NEMS structures other than the out-of-plane accelerometer and notably to the in-plane accelerometer of FIG. 9.

According to a variant embodiment of the first or second embodiment, which can be applied to another structure according to the invention, the third link 9' can be formed by double in-plane bending blades 91', rather than the single thick in-plane bending blades 91 illustrated in FIG. 7C or in FIG. 9.

Figure 10:
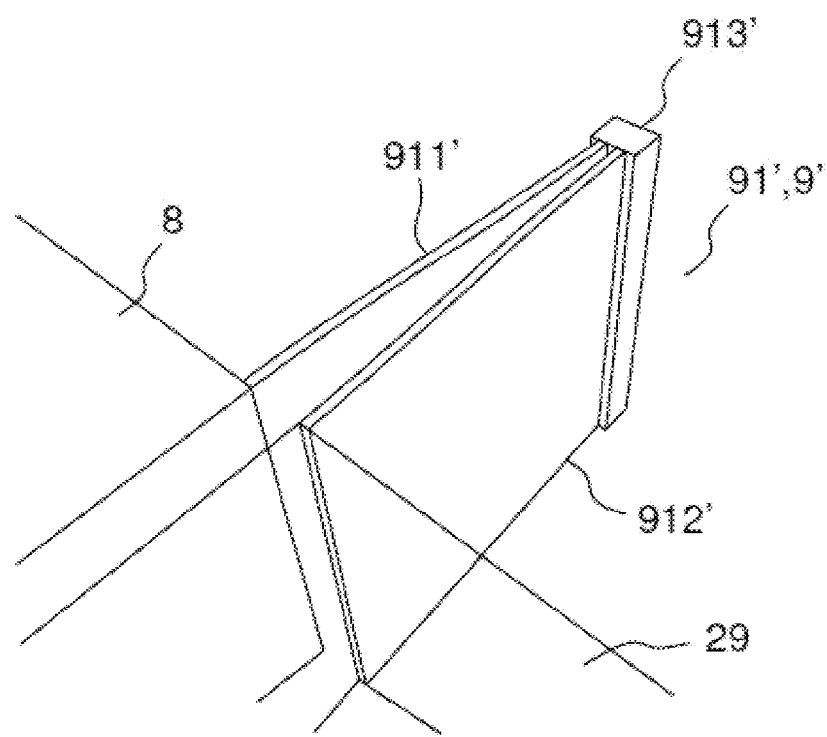
FIG. 10 represents a variant of a slide link for an accelerometer according to the first or second embodiment.

This variant third link is illustrated in FIG. 10. The double blade 91' represented comprises two blades 911', 912' meeting to form a U, each blade being elongate along the axis Y and thin along the axis X. The first blade 911' is linked to the transmission component 8, the second blade 912' is linked to the substrate by an anchoring block 29. The two blades 911' and 912' are also linked to one another by an intermediate link component 913'. This configuration opposes a much more linear stiffness to the transmission component 8 in its displacement in the desired direction X, notably upon strong displacements, even if that provides less stiffness in the direction Y.

Figure 11:
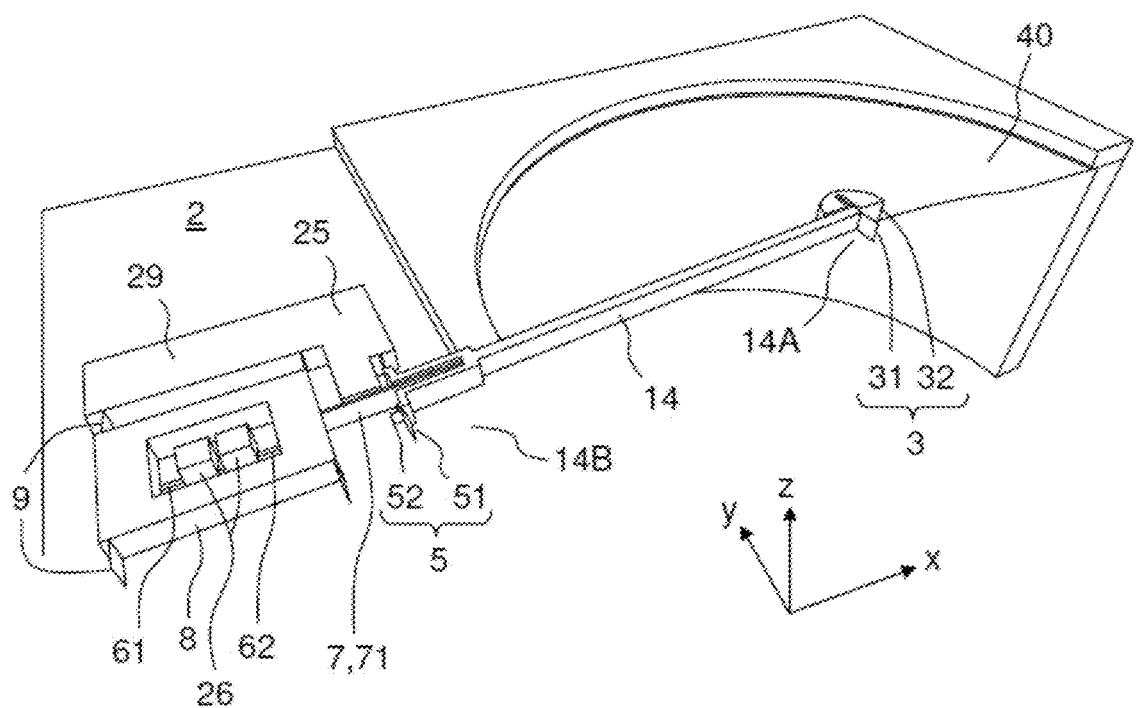
FIG. 11 represents a sensor (device for measuring a pressure variation) according to a third embodiment of the invention.

FIG. 11 represents a sensor (device for measuring a pressure variation) according to a third embodiment. It can be a microphone or an absolute or differential pressure sensor. For more legibility, some parts, such as the anchoring blocks for example, are represented only in a half-plane.

The device comprises a membrane 40 produced in the thin layer (NEMS) with, for example, a thickness of the order of 1 µm, in order for the membrane to ensure seal-tightness while remaining flexible. In the case of a microphone, the seal-tightness is not mandatory.

The out-of-plane displacement of the centre of the membrane 40 is transferred to a first end 14A of a lever arm 14, for example using an out-of-plane coupling link 3 formed by at least one thick torsion blade 31 and by one fixing element 32 for fixing the thick blade 31 to the membrane. Through the great thickness of this blade, this out-of-plane coupling link makes it possible to strongly couple the out-of-plane translation (in the direction Z). Furthermore, the fineness of the blade 31 in the direction X allows an angular torsional deformation about an axis of torsion parallel to the direction Y and a bending in the direction X. Thus, the lever arm 14, driven by a rotational movement, and the membrane 40 in out-of-plane movement, can be coupled in the direction Z without creating a hyperstatic system.

The lever arm 14 is preferably etched in the thick layer (MEMS) to obtain a sufficient rigidity.

The second end 14B of the lever arm is linked to the first link 5 (also called pivot link) at the base of the thick layer. As in the configuration of the out-of-plane accelerometer of FIGS. 7A to 7D, the first link 5 is formed by two thick torsion blades 51 and two thin out-of-plane bending blades 52. Each blade is linked on the one hand to the lever arm 14 and on the other hand to the substrate 2 of the MEMS-NEMS structure, using an anchoring block 25. The substrate 2 extends in the plane OXY (main plane). The torsion blades 51, etched in the thick layer, block the out-of-plane translation by virtue of their strong bending stiffness on Z and their anchoring, while exhibiting a weak angular stiffness by virtue of their short length in the direction X, allowing a torsion about the direction Y. The out-of-plane bending blades 52, etched in the thin layer, block the translation in the direction X by virtue of their strong compression stiffness in this direction X and their anchoring, while exhibiting a weak angular stiffness by virtue of their small thickness, allowing a bending about the direction Y. The combination of the two thick torsion blades 51 and two thin bending blades 52 thus blocks the out-of-plane and in-plane translations, while allowing an out-of-plane rotation about an axis of rotation Y5 in the direction Y and which is thus defined at the base of the thick layer (MEMS) of the torsion blades 51, at the intersection of the core of the thin layer (NEMS) of the bending blades 52 and of the core of the torsion blades 51. The first pivot link 5 thus allows a rotation of the lever arm 14 about the axis of rotation Y5, therefore an out-of-plane rotation relative to the substrate 2.

Likewise, as in the configuration of the out-of-plane accelerometer of FIGS. 7A to 7D, the second link 7 (also called coupling link) adapted to transmit the rotational movement of the lever arm 14 as a translational movement to the transmission component 8 consists of a thick out-of-plane bending blade 71 linked on the one hand to the lever arm 14 and on the other hand to the transmission component 8. The strong compression stiffness in the direction X of this thick and long blade makes it possible to transmit to the transmission component 8 the translation in the direction X of the lever arm 14 in the middle of the MEMS layer. Even if the thick bending blade 71 has a great thickness, its rotation by bending about the out-of-plane direction Z permitted by its fineness in the direction Y and the small out-of-plane bending movement about the axis of bending parallel to the direction Y make it possible to have the rotation of the lever arm 14 and the translation of the transmission component 8 coexist.

Advantageously, the thick coupling blade 71 is centred above its axis of bending to as closely as possibly approximate a pure angular bending and minimize its stiffness.

Since the axis of bending of the second link 7 appears in the middle of the MEMS thickness, the offset necessary between the first link and the second link is clearly obtained. The thick out-of-plane bending blade forming the coupling link 7 can therefore be seen as a connecting rod connected between the lever arm 14 and the transmission component 8.

Likewise, as in the configuration of the out-of-plane accelerometer of FIGS. 7A to 7D, the transmission component 8 illustrated is formed by a rectangular frame 81. The mobile transmission component 8 is linked to two strain gauges 61, 62 so as to transmit to them a compression force and/or a tension force. The strain gauges 61, 61 are disposed inside the rectangular frame 81 forming the transmission component and are disposed in said frame symmetrically relative to the direction Y. Thus, the strain gauges are connected with the two opposing sides of the rectangular frame in the direction X. Moreover, the strain gauges are linked to the substrate 2 by anchoring blocks 26 disposed inside the rectangular frame.

The transmission component 8 is kept in in-plane translation by at least two thick in-plane bending blades 91, 92 anchored to the substrate by at least one anchoring block 29, the blades forming the third link or slide link 9. These blades exhibit a strong out-of-plane stiffness, due to their great thickness and their anchoring. Furthermore, their strong compression stiffness due to their great width in the direction Y makes it possible to block the translation in this direction Y. Finally, their short length in the direction X generates a weak stiffness in that direction X. That makes it possible to guide the translation of the transmission component 8 in the direction X.

The coupling link 7 combined with the third link 9 makes it possible to transform the rotation of the lever arm 14 about the direction Y into a translation of the transmission component 8 in the direction X.

Since the transmission component 8 is mobile in in-plane translation (in the direction X), the strain gauges undergo only a pure compression or a pure tension, without spurious deformation. Thus, the position of the gauges is inconsequential. There is notably no more space constraint for the positioning of the anchoring blocks of the gauges since the latter can be offset.

Figure 12A:
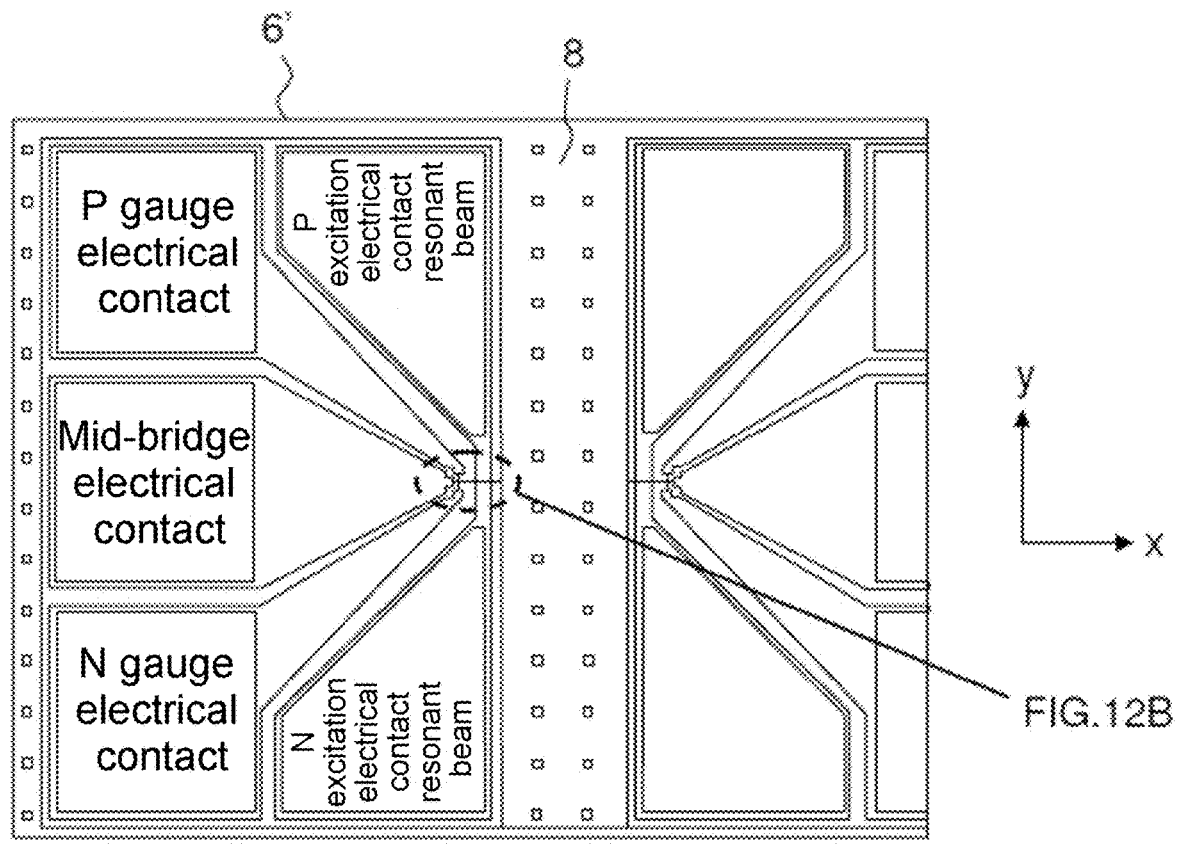
FIGS. 12A-12B illustrate a variant of a sensor according to the invention, the detection means being of resonator type.
Figure 12B:
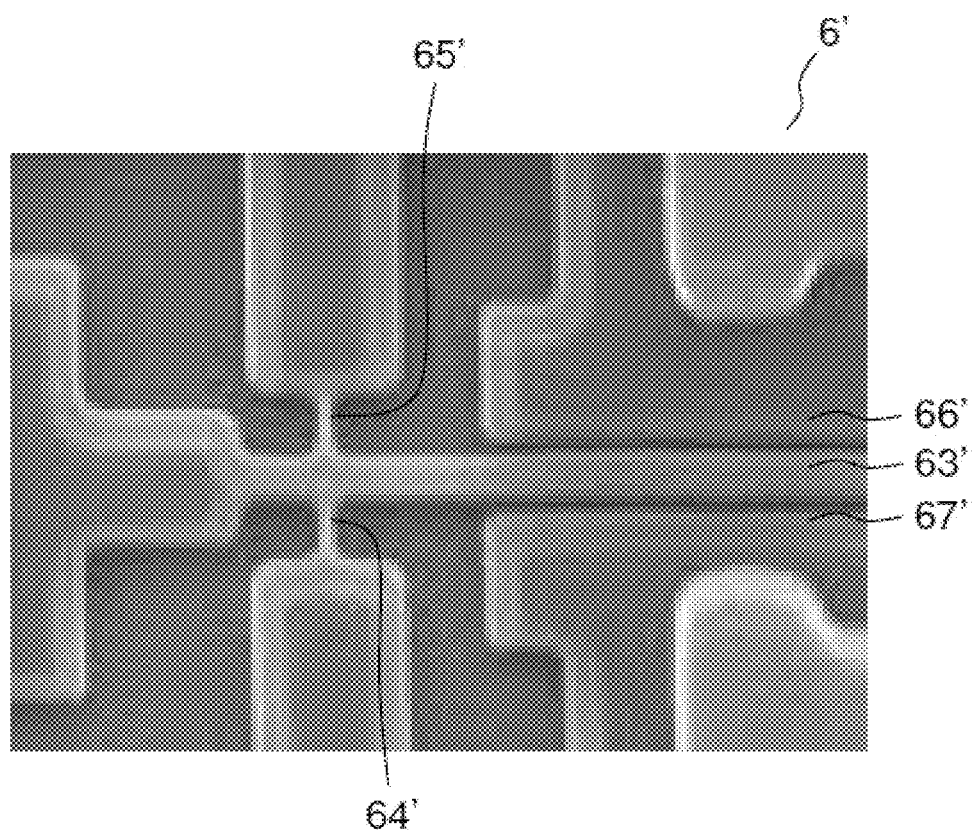

FIGS. 12A and 12B illustrate a variant of a sensor (accelerometer, gyrometer, device for measuring a pressure variation, etc.) according to the invention, the detection means 6' being of resonator type.

FIGS. 12A and 12B more specifically illustrate said detection means 6' linked with the transmission component 8. They comprise a resonance beam 63' linked to the transmission component. When the transmission component 8 is displaced in the direction X, it compresses or stretches the resonance beam 63', thus modifying its stiffness and therefore its deformation modes. By setting the resonance beam in motion by an electrostatic force formed by two electrodes 66' and 67' and by measuring the deformation of the beam using the two piezoresistive gauges 64' and 65', it is possible to follow the trend of the resonance modes and deduce therefrom the strain applied to the resonance beam. There is therefore a need for 3 to 5 contacts, which takes much more space than a direct piezoresistive readout. The invention makes it possible to offset the gauges relative to the mobile component to place these contacts.

This variant is suited to the sensors of the different embodiments and variants previously described. More generally, it applies to a sensor according to the invention.

Throughout the embodiments described, "thin" should be understood to mean of the order of a hundred or so nanometres (nm), and less than a few micrometres (μm) (NEMS), and "thick" should be understood to mean between a few μm and a few tens of μm (MEMS).

Preferably, the thickness of a thin layer is between 100 nm and 500 nm.

Preferably, the thickness of a thick layer is between 5 and 40 μm, even between 10 and 20 μm.

The mechanical link and the microelectromechanical and/or nanoelectromechanical structure of the invention can be fabricated by using the known technologies of micromachining (and/or nanomachining) accelerometers on silicon.

To produce such a mechanical link and such a microelectromechanical and nanoelectromechanical structure, the following general method can be implemented:
- the first step is to have a silicon on insulator (SOI) wafer comprising at least one substrate layer of Si, on which is disposed a first layer of silicon oxide (SiO$_2$) of a few hundreds of nanometres to a few microns serving as first sacrificial layer when the mobile components are released, and on the first layer of SiO$_2$ there is disposed a thin layer of monocrystalline silicon (NEMS) of a few hundreds of nanometres to a few microns for producing the strain gauges and the thin blades;
- the patterns of the NEMS layer are produced by photolithography and etching to cut out the strain gauges and the thin blades;
- a second sacrificial layer of silicon oxide, it too of a few hundreds of nanometres to a few microns, is then deposited. This second layer of SiO$_2$ is etched until it remains only at a few points where it will serve as stop layer upon the deep etching of the thick layer (MEMS) in the next step. Thus, the NEMS layer can be protected. The second layer of oxide is destroyed in the final release step;
- then a silicon epitaxy step is performed, which makes it possible to obtain the thick layer (MEMS, a few microns to a few tens of microns). This layer is formed by photolithography and deep etching (or deep reactive ion etching);
- finally, the mobile components are released by the partial etching of the sacrificial layers of silicon oxide. It is notably possible to expose the wafer to hydrofluoric acid, advantageously in vapour phase, for a controlled time.

Throughout the embodiments, the detection means can comprise a piezoresistive or piezoelectric strain gauge, a resonator, a capacitance or even a combination of said means. Advantageously, they can comprise at least two strain gauges, two resonators or two capacitances so as to produce a differential measurement.

In the case where there is a capacitive system with a one translational electrode, the transmission component can be replaced directly by the translational electrode. In this case, the third link of slide link type is configured to guide the translational electrode in the direction of in-plane translation, and not the transmission component, which can be eliminated.

Throughout the embodiments, the mobile component can be a mobile mass, a lever arm or any other suitable component. A lever arm can be either a part of a mobile mass, or linked to a mobile mass, to a membrane or a piston, or more generally to a mobile part whose motion is to be measured. The mobile component can be covered with magnetic material to produce a magnetometer.

The mechanical link according to the present invention can be applied to all the MEMS-NEMS structures that exhibit a rotational movement of a mobile component relative to a fixed component, generally a substrate.

Such an MEMS-NEMS structure can be used for sensors with out-of-plane detection such as accelerometers, pressure sensors, microphones, gyrometers, magnetometers, or for sensors with in-plane detection such as accelerometers, gyrometers, magnetometers, microphones, etc.

The different embodiments and variants presented can be combined with one another.

Furthermore, the present invention is not limited to the embodiments previously described but extends to any embodiment that falls within the scope of the claims.

The invention claimed is:

1. A mechanical link for a microelectromechanical and/or nanoelectromechanical structure, said structure comprising a mobile component, a fixed component extending on a main plane (OXY) and means for detecting the displacement of the mobile component relative to the fixed component, said mechanical link comprising:
    a first link linked to the fixed component and to the mobile component and capable of allowing the rotation of said mobile component relative to said fixed component about an axis of rotation;
    a second link connecting the mobile component to the detection means at a given distance ($l_{exc}$) relative to the axis of rotation in a direction at right angles to said axis of rotation; and
    a third link linked to the fixed component and to the detection means and configured to guide said detection means in a direction of translation (X) in the main plane of the fixed component such that the combination of the second link and of the third link is capable of transforming the rotational movement of the mobile component into a translational movement of the detection means in the direction of translation (X) in the main plane (OXY) of the fixed component.

2. The mechanical link according to claim 1, further comprising a transmission component linked to the detection means, the second link being linked to the mobile component and to the transmission component.

3. The mechanical link according to claim 2, wherein the transmission component is formed by a thick frame, for example a frame with rectangular or square base formed by four thick beams linked to one another along their thickness.

4. The mechanical link according to claim 3, wherein the transmission component further comprises a central beam extending in the direction of rotation and disposed substantially in the middle of the thick frame.

5. The mechanical link according to claim 1, wherein the first link is an out-of-plane pivot link relative to the main plane (OXY) of the fixed component and in that it comprises at least one first blade intended to work by torsion about an axis of rotation and/or at least one second blade intended to work by bending about the axis of rotation, each of the first and second blades being linked on one side to the mobile component, and on the other side to the fixed component, for example using at least one anchoring block.

6. The mechanical link according to claim 5, wherein the at least one first blade is a thick blade.

7. The mechanical link according to claim 5, wherein the at least one second blade is a thin blade.

8. The mechanical link according to claim 5, wherein the at least one second blade is a thick blade.

9. The mechanical link according to claim 5, wherein the second link comprises a thick out-of-plane bending blade extending in the direction of translation.

10. The mechanical link according to claim 5, wherein the second link comprises at least one thin out-of-plane bending blade extending in the direction of translation.

11. The mechanical link according to claim 1, wherein the first link is a pivot link in the main plane (OXY) of the fixed component and comprises at least two thick in-plane bending blades that are non-colinear and configured so that the intersection of said thick blades forms a pivot link in the plane on an axis of rotation at right angles to the main plane (OXY).

12. The mechanical link according to claim 11, wherein the second link comprises a thick in-plane bending blade extending in the direction of translation.

13. The mechanical link according to claim 1, wherein the third link comprises at least one thick blade for bending in the main plane (OXY), fine in the direction of translation and linked on one side to the fixed component, for example by at least one anchoring block and on the other side to the detection means or to the transmission component.

14. The mechanical link according to claim 1, wherein the third link comprises at least one thick double blade for bending in the plane (OXY), said thick double blade comprising a first thick blade linked to the detection means or to the transmission component, one second thick blade linked to the fixed component, for example by at least one anchoring block and one intermediate link component linking the first and second thick blades.

15. A microelectromechanical and/or nanoelectromechanical structure comprising a mobile component, a fixed component extending on a plane (OXY), means for detecting the displacement of the mobile component relative to the fixed component and a mechanical link according to claim 1, said mechanical link being configured to link the mobile component and the detection means, said detection means being disposed so as to measure the translational displacement in the direction of translation.

16. The microelectromechanical and/or nanoelectromechanical structure according to claim 15, wherein the detection means comprise at least one strain gauge of piezoresistive or piezoelectric type, a resonance beam, a capacitance or a combination of said means.

17. The microelectromechanical and/or nanoelectromechanical structure according to claim 15, wherein the detection means comprise two strain gauges.

18. The microelectromechanical and/or nanoelectromechanical structure according to claim 15, the mechanical link comprising a transmission component linked to the detection means, the second link being linked to the mobile component and to the transmission component.

19. The microelectromechanical and/or nanoelectromechanical structure according to claim 18, the detection means being disposed inside the transmission component.

20. A device for measuring a pressure variation comprising a microelectromechanical and/or nanoelectromechanical structure according to claim 15, comprising a membrane or a piston linked to a lever arm forming the mobile component.

21. An accelerometer comprising a microelectromechanical and/or nanoelectromechanical structure according to claim 15, comprising a mass forming the mobile component or a lever arm forming the mobile component.

* * * * *